(12) United States Patent
Wang et al.

(10) Patent No.: US 12,107,601 B2
(45) Date of Patent: Oct. 1, 2024

(54) DATA ERROR CORRECTION METHOD, APPARATUS, DEVICE, AND READABLE STORAGE MEDIUM

(71) Applicant: SHENZHEN DAPU MICROELECTRONICS CO., LTD., Shenzhen (CN)

(72) Inventors: Yan Wang, Shenzhen (CN); Weijun Li, Shenzhen (CN)

(73) Assignee: SHENZHEN DAPU MICROELECTRONICS CO., LTD., Shenzhen (CN)

( * ) Notice: Subject to any disclaimer, the term of this patent is extended or adjusted under 35 U.S.C. 154(b) by 89 days.

(21) Appl. No.: 17/733,165

(22) Filed: Apr. 29, 2022

(65) Prior Publication Data

US 2022/0255558 A1 Aug. 11, 2022

Related U.S. Application Data

(63) Continuation of application No. PCT/CN2020/102018, filed on Jul. 15, 2020.

(30) Foreign Application Priority Data

Nov. 6, 2019 (CN) .......................... 201911077492.3

(51) Int. Cl.
*H03M 13/00* (2006.01)
*G06N 3/08* (2023.01)
(Continued)

(52) U.S. Cl.
CPC ............ *H03M 13/033* (2013.01); *G06N 3/08* (2013.01); *H03M 13/1102* (2013.01)

(58) Field of Classification Search
None
See application file for complete search history.

(56) References Cited

U.S. PATENT DOCUMENTS 5,253,328 A * 10/1993 Hartman ............. G06F 11/1476
365/49.1
2015/0164413 A1* 6/2015 Wu ...................... A61B 5/4821
600/301

(Continued)

FOREIGN PATENT DOCUMENTS

CN 102124527 A 7/2011
CN 102881334 A 1/2013
(Continued)

OTHER PUBLICATIONS

International Search Report and Written Opinion in corresponding PCT Application No. PCT/CN2020/102018 dated Oct. 15, 2020 (9 pages).

*Primary Examiner* — Mujtaba M Chaudry
(74) *Attorney, Agent, or Firm* — Bayes PLLC

(57) ABSTRACT

A data error correction method, apparatus, device, and readable storage medium are disclosed. The method includes: acquiring target data to be error-corrected; performing error correction on the target data using an error-correcting code to obtain first data; judging whether the performing of the error correction on the target data is successful; responsive to the performing of the error correction on the target data being not successful, correcting the target data using a target neural network to obtain second data, determining the second data as the target data, and continuing to perform the error correction on the target data again; and responsive to the performing of the error correction on the target data being successful, determining the first data as the error-corrected target data.

20 Claims, 8 Drawing Sheets

(51) Int. Cl.
*H03M 13/03* (2006.01)
*H03M 13/11* (2006.01)

(56) References Cited

U.S. PATENT DOCUMENTS

| | | | |
|---|---|---|---|
| 2019/0197409 A1* | 6/2019 | Frinken | G06N 3/088 |
| 2019/0258934 A1* | 8/2019 | Sorokin | G06N 3/04 |
| 2019/0311254 A1 | 10/2019 | Turek et al. | |
| 2020/0034666 A1* | 1/2020 | Yun | G06F 18/214 |
| 2020/0104741 A1* | 4/2020 | Peng | G06F 11/1048 |
| 2020/0174864 A1* | 6/2020 | Bhardwaj | G06N 3/04 |
| 2020/0364118 A1* | 11/2020 | Sun | G06F 11/1666 |

FOREIGN PATENT DOCUMENTS

| | | |
|---|---|---|
| CN | 103019883 A | 4/2013 |
| CN | 103377664 A | 10/2013 |
| CN | 110798225 A | 2/2020 |

\* cited by examiner

DATA ERROR CORRECTION METHOD, APPARATUS, DEVICE, AND READABLE STORAGE MEDIUM

CROSS-REFERENCE TO RELATED APPLICATIONS

The present application is continuation of International Application No. PCT/CN2020/102018, filed on Jul. 15, 2020, entitled "DATA ERROR-CORRECTION METHOD AND APPARATUS, DEVICE, AND READABLE STORAGE MEDIUM," which claims the priority to Chinese Patent Application No. 201911077492.3, filed on Nov. 6, 2019, entitled "DATA ERROR. CORRECTION METHOD, APPARATUS, DEVICE, AND READABLE STORAGE MEDIUM," both of which are incorporated herein by reference in their entirety.

TECHNICAL FIELD

The present application relates to the field of computer encoding technologies, and in particular, to a data error correction method, apparatus, device, and readable storage medium.

BACKGROUND

In the process of data transmission and storage, data errors will inevitably occur due to the influence of factors such as environment, medium, distance, and time. In order to identify and correct erroneous data in the data, an Error-Correcting Code is often used to correct the data in the prior art.

However, various error-correcting codes have limited error correction capabilities. For example, Hamming Code can correct an error of one bit at most; Low-Density Parity-Check (LDPC) code generally has an error correction capability of 50-60 bits/4 KB. Therefore, when the number of bits of erroneous data in the data exceeds the error correction capability of the error-correcting code, the erroneous data in the data cannot be located and corrected, resulting in error correction failures and data loss.

Therefore, how to avoid error correction failures and data loss in a data error correction process is a problem to be solved by those skilled in the art.

SUMMARY

In view of this, an objective of the present application is to provide a data error correction method, apparatus, device, and readable storage medium, so as to avoid error correction failures and data loss in a data error correction process. Its specific solutions are as follows:

In a first aspect, a data error correction method is provided in the present application, including:

S11: acquiring target data to be error-corrected;

S12: performing an error correction on the target data using an error-correcting code to obtain first data;

S13: judging whether the performing of the error correction on the target data is successful; if yes, performing S15, and if not, performing S14, S14: correcting the target data using a target neural network to obtain second data, determining the second data as the target data, and performing S12; and S15: determining the first data as the error-corrected target data.

Preferably, the correcting the target data using the target neural network to obtain the second data includes:

separating a data part and a check part of the target data;

correcting the data part using the target neural network to generate a processing result; and combining the processing result and the check part to obtain the second data.

Preferably, the correcting the data part using the target neural network to obtain the processing result includes:

inputting the data part to the target neural network in a reverse order to obtain the processing result.

Preferably, the performing the error correction on the target data using the error-correcting code to obtain the first data includes:

separating a data part and a check part of the target data; and revising erroneous data bits of the data part using the error-correcting code to obtain the first data, Preferably, the correcting the target data using the target neural network to obtain the second data includes:

inputting the target data to the target neural network in a reverse order to obtain the second data.

Preferably, a process of generating the target neural network includes:

constructing a neural network, the neural network including an encoding subnetwork and a decoding subnetwork;

inputting training data containing different types of data to train the neural network; and responsive to an error loss function of the neural network converging to a steady state during the training, determining the neural network as the target neural network Preferably, after the determining the neural network as the target neural network, the method further includes:

dividing the training data to multiple data sets, data in each data set having an association relationship; and training the target neural network using each data set separately to obtain multiple target neural networks corresponding to the data sets.

Preferably, the correcting the target data using the target neural network to obtain the second data includes:

determining data features of the target data; and selecting; from the multiple target neural networks, a target neural network having the highest matching degree with the data feature to correct the target data, so as to obtain the second data.

In a second aspect, a data error correction apparatus is provided in the present application; including:

an acquisition module configured to acquire target data to be error-corrected;

an error correction module configured to perform an error correction on the target data using an error-correcting code to obtain first data;

a judgment module configured to judge whether the error correction on the target data is successful;

a correction module configured to, if the error correction on the target data fails, correct the target data using a target neural network to obtain second data, determine the second data as the target data, and transmit the target data to the error correction module; and a determination module configured to, if the error correction on the target data is successful, determine the first data as the error-corrected target data.

In a third aspect, a data error correction device is provided in the present application, including:

a memory configured to store a computer program; and a processor configured to execute the computer program to implement the data error correction method as disclosed in the foregoing.

In a fourth aspect, a readable storage medium is provided in the present application, which is configured to save a computer program, where the computer program, when executed by a processor, implements the data error correction method as disclosed in the foregoing.

As it can be seen from the above solutions, a data error correction method is provided in the present application, including: S11: acquiring target data to be error-corrected; S12: performing an error correction on the target data using an error-correcting code to obtain first data; S13: judging whether the error correction on the target data is successful; if yes, performing S15; and if not, performing S14; S14: correcting the target data using a target neural network to obtain second data, detemining the second data as the target data, and performing S12; and S15: determining the first data as the error-corrected target data.

As it can be seen, this method uses the error-correcting code to correct the target data. If the error correction fails, a target neural network is used to correct the target data, so as to obtain the second data, and the second data is determined as the target data, for performing an error correction on the data using the error-correcting code again; so as to obtain the first data that succeeds in the error correction. The first data is then determined as the target data that has been error-corrected. Therefore, the correct target data is obtained. As can be seen, the present application can correct data using the error-correcting code and the target neural network cooperatively, so that failures of data error correction with the error-correcting code and data loss in the error correction process can be avoided.

Correspondingly, a data error correction apparatus, device, and readable storage medium provided in the present application also have the above technical effects.

BRIEF DESCRIPTION OF THE DRAWINGS

In order to more clearly illustrate the technical solutions in the embodiments of the present application or in the prior art, accompanying drawings required for the description of the embodiments or the prior art will be briefly introduced below. Obviously, the accompanying drawings in the following description are merely embodiments of the present application. For those of ordinary skill in the art, other accompanying drawings can also be derived according to the provided accompanying drawings without any creative efforts.

DETAILED DESCRIPTION

The technical solutions in the embodiments of the present application will be clearly and completely described below with reference to the accompanying drawings in the embodiments of the present application. Obviously, the described embodiments are merely part of the embodiments of the present application, rather than all of the embodiments. Based on the embodiments in the present application, all other embodiments derived by those of ordinary skill in the art without creative efforts shall fall within the protection scope of the present application.

At present, data is corrected using only an error-correcting code, and not all erroneous data in the data can be located and corrected, which will lead to error correction failures and data loss. Therefore, the present application provides a data error correction solution, which can avoid error correction failures and data loss in a data error correction process.

Figure 1:
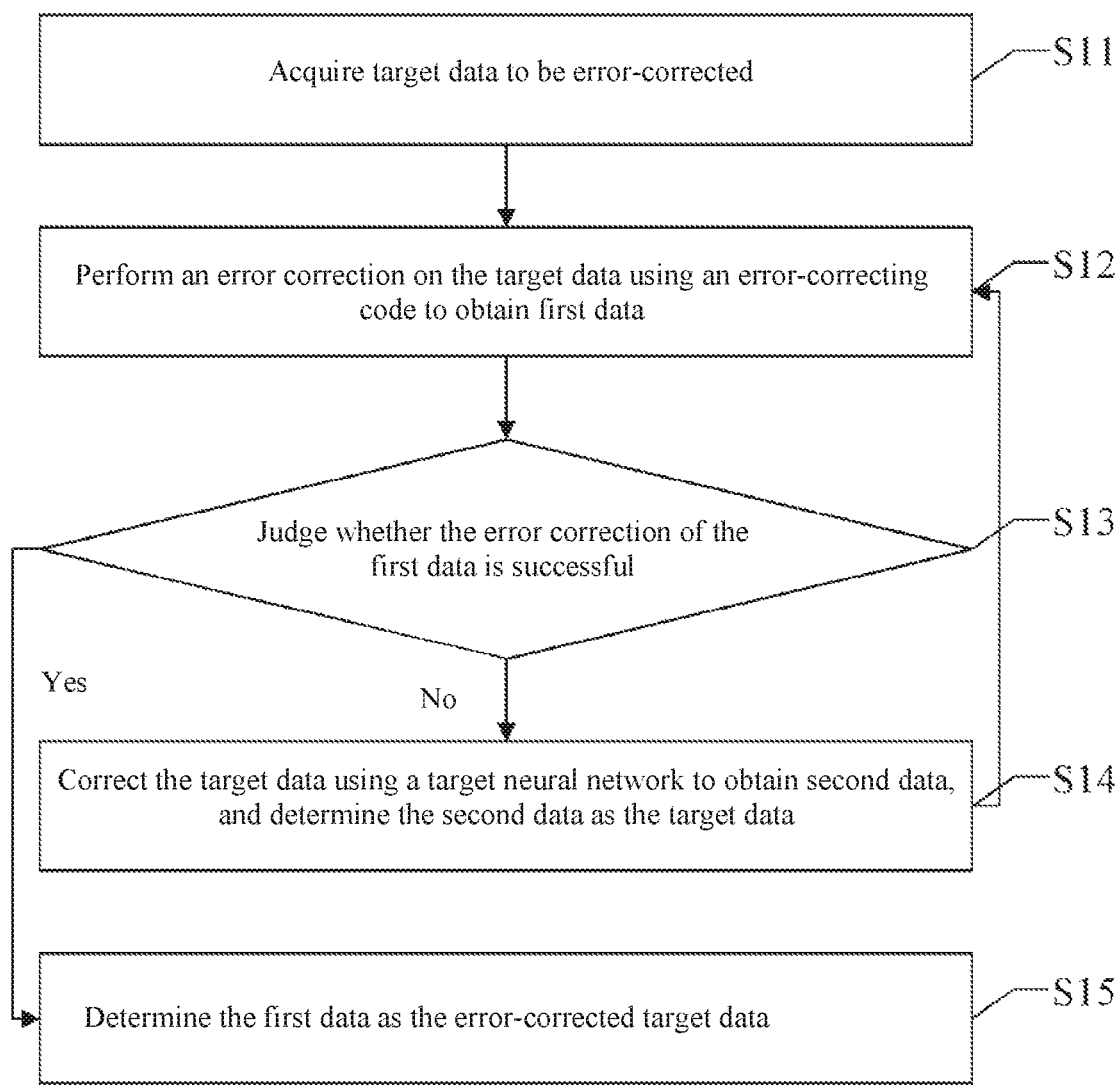
FIG. 1 is a flowchart of a first data error correction method disclosed in the present application.

Referring to FIG. 1, a first data error correction method is disclosed in an embodiment of the present application, including:

S11: acquiring target data to be error-corrected;

S12: performing an error correction on the target data using an error-correcting code to obtain first data;

S13: judging whether the error correction of the first data is successful; if yes, performing S15; and if not, performing S14;

S14: correcting the target data using a target neural network to obtain second data, determining the second data as the target data, and performing S12; and S15: determining the first data as the error-corrected target data.

It should be noted that the error-correcting code may be any type of error-correcting code, such as Hamming code, Bose Ray-Chaudhuri Hocquenghem (BCH), and Polar Code. The target neural network may also be any type of neural network, such as a Recurrent Neural Network (RNN), a Gated Recurrent Unit (GRU), a Fully-Connected Network (FCN), a Convolutional Neural Network (CNN), a Random Forest Algorithm, a Support Vector Machine (SVM), and a Logical Regression.

Specifically, if the error correction of the first data is successful, it indicates that the first data is the target data that has been error-corrected; otherwise, the target neural network is used for correcting the target data to reduce the number of bits of the erroneous data in the target data. Thus, the data can be error-corrected using the error-correcting code. A current decoder for codes generally adopts a design solution of iterative decoding. If a calculation of the iterative decoding can be successfully converged, the calculation is completed, i.e., the decoding is successful; otherwise, the decoding fails. Therefore, the key to judging whether the error correction is successful or not is whether the calculation of iterative decoding can complete the convergence. For details, reference can be made to the prior art, which will not be repeated here in this specification.

In an implementation, the correcting the target data using a target neural network to obtain second data includes: separating a data part and a check part of the target data; and correcting the data part using the target neural network to obtain the second data.

In an implementation, the performing the error correction on the target data using an error-correcting code to obtain first data includes: separating a data part and a check part of the target data; and correcting erroneous data bits of the data part using the error-correcting code to obtain the first data.

It should be noted that, during data transmission or storage, each piece of data includes a data part and a check part. The data and an error pattern of the data part are more correlated; and account for a large proportion in one piece of data (generally over 90%), while the check part is identical or similar for each piece of data in the same system. Therefore, only the data part of the data can be processed using the target neural network or the error-correcting code. After the processing is completed, a result from the processing and the original check part may be combined again to acquire the processed data.

In an implementation, the correcting the target data using a target neural network to obtain second data includes: inputting the target data to the target neural network in a reverse order to obtain the second data. Inputting the target data to the target neural network in the reverse order enables a position of the data to be processed to be closer to a position where the data is encoded, which facilitates information recording and encoding. For details, reference can be made to the introduction of the following embodiments.

As it can be seen, in the embodiments of the present application, after an error correction is performed on target data using an error-correcting code to obtain first data, if the error correction of the first data fails, the target neural network is used for correcting the target data, thereby obtaining the second data. The second data is determined as the target data, so that the error-correcting code is used for correcting the data again, thereby obtaining the first data with the successful error correction. The first data is then determined as the target data that has been error-corrected, and the correct target data is obtained. As can be seen, the present application can correct data using the error-correcting code and the target neural network cooperatively, so that failures of data error correction with the error-correcting code and data loss in the error correction process can be avoided.

Figure 2:
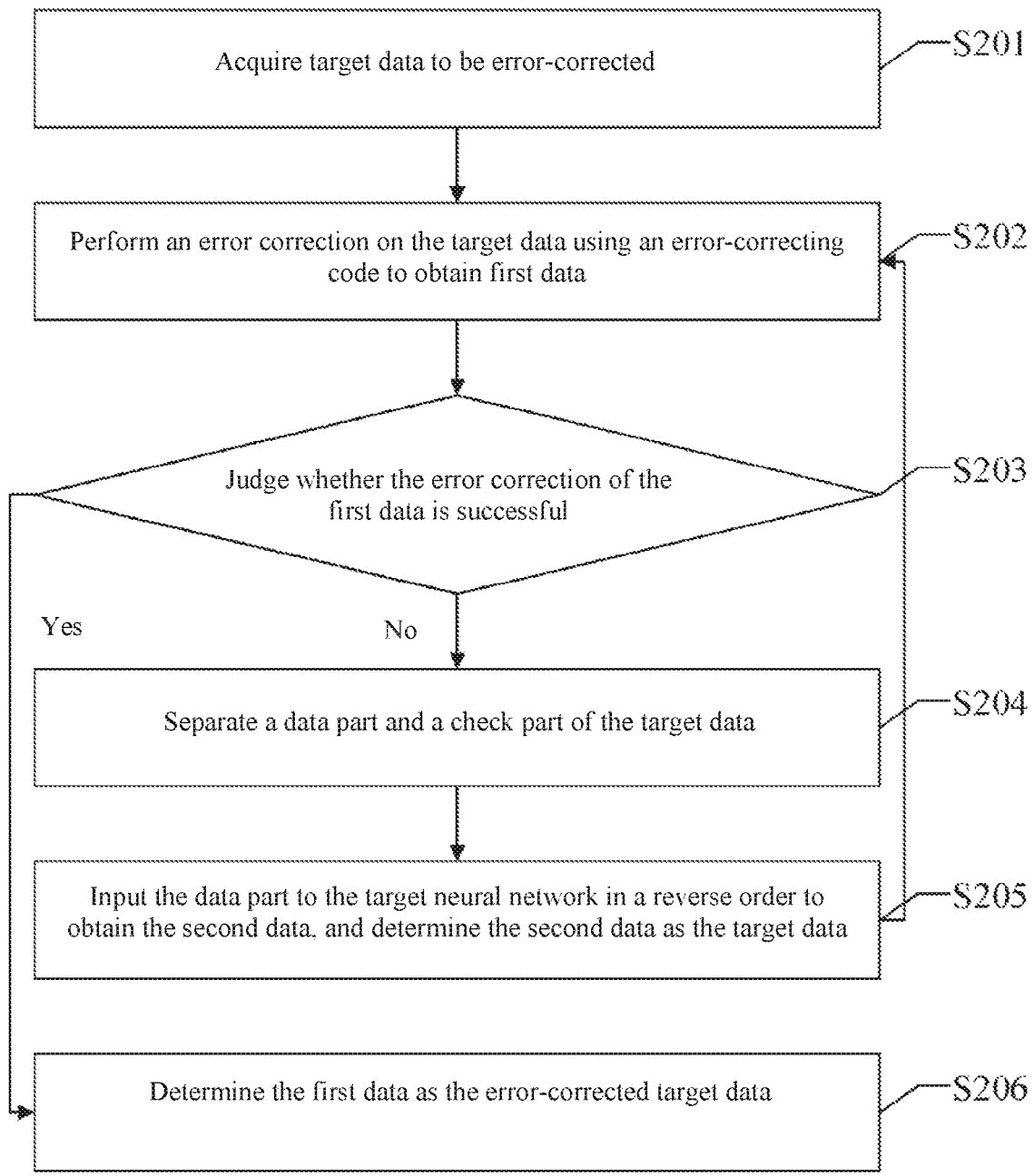
FIG. 2 is a flowchart of a second data error correction method disclosed in the present application.

Referring to FIG. 2, a second data error correction method is disclosed in an embodiment of the present application, including:

S201: acquiring target data to be error-corrected;

S202: performing an error correction on the target data using an error-correcting code to obtain first data;

S203: judging whether the error correction of the first data is successful; if yes, performing S206; and if not, performing S204;

S204: separating a data part and a check part of the target data;

S205: inputting the data part to the target neural network in a reverse order to obtain the second data, determining the second data as the target data, and performing S202;

Specifically, inputting the data part to the target neural network in the reverse order, and recombining the obtained output data with the check part to obtain the second data;

S206: determining the first data as the error-corrected target data.

In this embodiment, after the second data is obtained, it may be further determined whether the error correction of the second data is successful; if yes, the second data may be directly determined as the target data that has been error-corrected; and if not, the second data is determined as the target data, and S202 is performed.

In this embodiment, inputting the data part of the target data to the target neural network in the reverse order enables a position of the data to be processed to be closer to a position where the data is encoded, thus facilitating information recording and encoding. For example, the data part of the target data to be processed is: "ABSD," after it is reversed, "DSBA" may be obtained, "DSBA" is then input to the target neural network, and the target neural network encodes the data in the order of "DSBA," but the data is decoded in the order of "ABSD." In this way, for "A," its encoding position and decoding position are relatively dose. Likewise, encoding positions of "B, S, and D" are relatively close to their respective decoding positions. According to the common encoding and decoding methods, the data is encoded and decoded in the order of "AB SD." For each character, there are 3 characters between the encoding position and the decoding position, so it is inconvenient to record character information. It should be noted that the above example is only for illustrating the technical effects of this method, and the encoding and decoding of data in an actual application process should not be so simply understood.

In an implementation, the performing the error correction on the target data using an error-correcting code to obtain first data includes: separating a data part and a check part of the target data; and correcting erroneous data bits of the data part using the error-correcting code to obtain the first data.

It should be noted that, during data transmission or storage, each data packet includes a data part and a check part. The data and an error pattern in the data part are more correlated; and account for a large proportion in one piece of data (generally over 90%), while the check part is identical or similar for each piece of data in the same system. Therefore, only the data part of the data can be processed using the error-correcting code. After the processing is completed, a result from the processing and the original check part may be combined again to acquire the corrected data.

It should be noted that, other implementation steps in this embodiment are the same as or similar to the above embodiments, and thus are not described again in this embodiment.

As it can be seen from the above, in this embodiment, after the error correction is performed on the target data using the error-correcting code to obtain the first data, if the error correction of the first data fails, the target data is corrected using the target neural network, thereby obtaining the second data. The second data is determined as the target data, so that the error correction is performed on the data using the error-correcting code again to obtain the first data that succeeds in the error correction. The first data is determined as the target data that has been error-corrected, and the correct target data is thus obtained. As can be seen, the present application can correct data using the error-correcting code and the target neural network cooperatively, so that failures of data error correction with the error-correcting code and data loss in the error correction process can be avoided.

In view of any of the above embodiments, it should be noted that a process of generating the target neural network includes: constructing an initial neural network, the initial neural network including an encoding subnetwork and a decoding subnetwork; inputting training data including different types of data to train the initial neural network; and determining, if an error loss function (e.g., a cross-entropy loss function) of the initial neural network converges to a stable state during the training process, the current initial neural network as the target neural network.

Specifically, the error loss function is also referred to as a loss function. The cross-entropy loss function may be used as a loss function in a neural network, which uses a sigmoid function to avoid the problem of reducing the learning rate of a mean square error loss function during gradient descent, because the learning rate can be controlled by an output error. For the specific error loss function, reference can be made to the introduction of the prior art, which will not be repeated in this specification, It should be noted that the target neural network obtained by training data containing different types of data is well universal. If it is intended to obtain a better targeting neural network, after the current initial neural network is determined as the target neural network, the method may further include: dividing the training data into multiple data sets, data in each data set having an association relationship; and training the target neural network using each data set separately to obtain multiple target neural networks corresponding to the data sets. Each target neural network thus obtained have a unique feature. For example, if the data in a data set has a spatially adjacent relationship, the target neural network obtained by training the data set will be able to better correct the spatially adjacent data, and therefore, the feature of the target neural network may be determined as being spatially adjacent. Therefore, when the data to be processed is spatially adjacent data, the matching degree between the data feature of the data and the target neural network is the highest, and the target neural network can better process the data. The target neural network can reduce the amount of erroneous data in the data, thus providing a guarantee for the successful error correction of the error-correcting code.

The association relationship includes: being adjacent spatially and/or adjacent temporally, and may also include: association in business applications, association in data formats, and the like.

In an implementation, the correcting the target data using a target neural network to obtain second data includes: determining a data feature of the target data, and selecting, from the multiple target neural networks, a target neural network having the highest matching degree with the data feature to correct the target data, so as to obtain the second data. Specifically, the matching degree between the data feature of the data and the target neural network may be obtained by calculation according to the data feature of the data and a network feature of the target neural network.

In the neural network, the encoding subnetwork and the decoding subnetwork exist independently, and the encoding subnetwork can be shared. In other words, multiple target neural networks share one encoding subnetwork, but each of them has a particular decoding subnetwork; therefore, when the same piece of data is corrected using multiple neural networks at the same time, only one encoding calculation is required, avoiding repeated encoding.

The following examples can be implemented according to the data error correction method provided in the present application.

Figure 3:
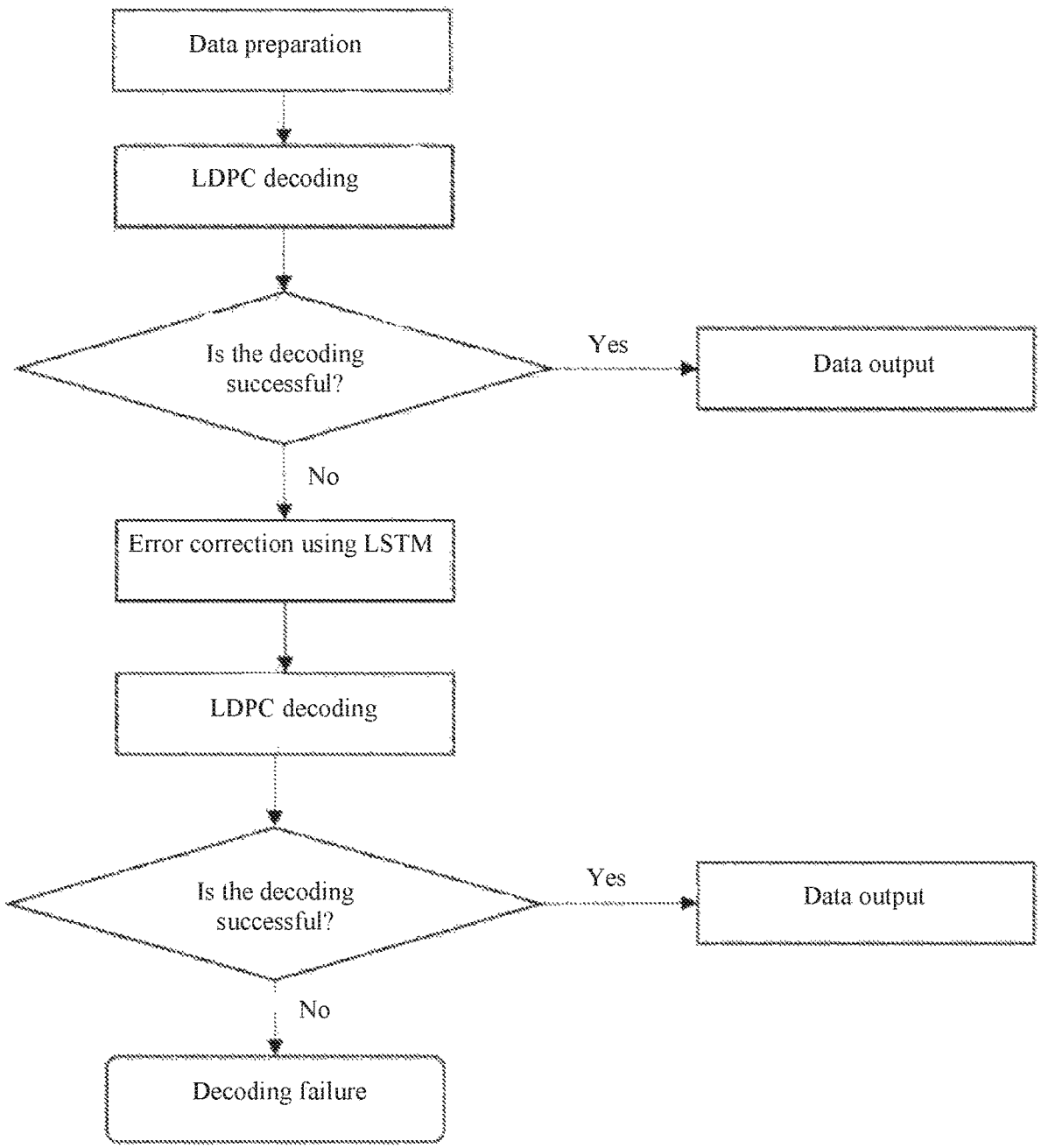
FIG. 3 is a flowchart of a third data error correction method disclosed in the present application.

In this embodiment, an LDPC is selected as the error-correcting code, a Long Short-Term Memory (LSTM) network is selected as the neural network, and a process of data error correction by the combination of the two is shown in FIG. 3.

Figure 4:
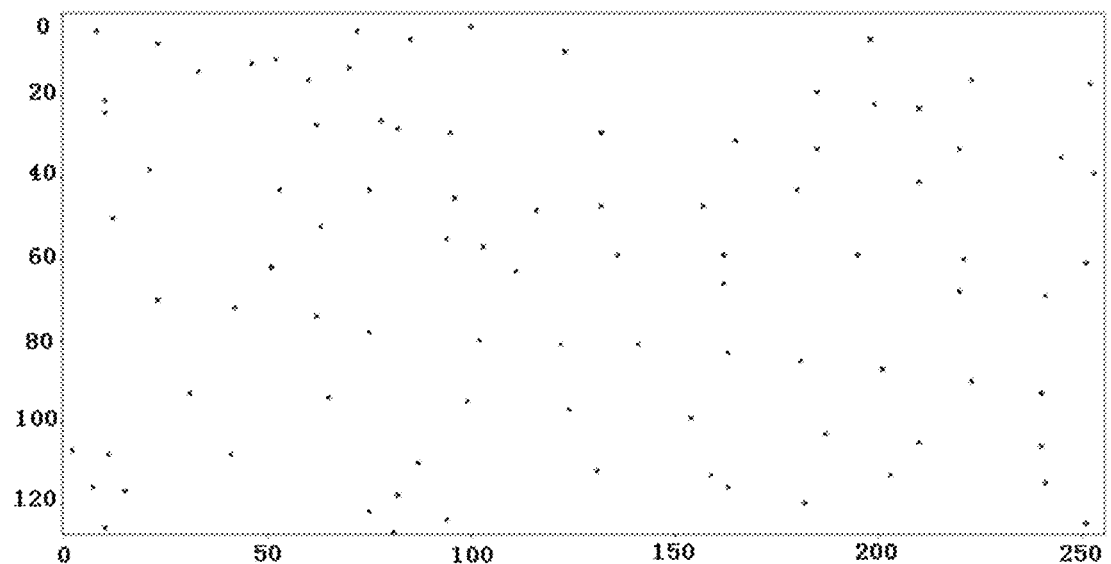
FIG. 4 is a schematic diagram of a first type of error data distribution disclosed in the application.
Figure 5:
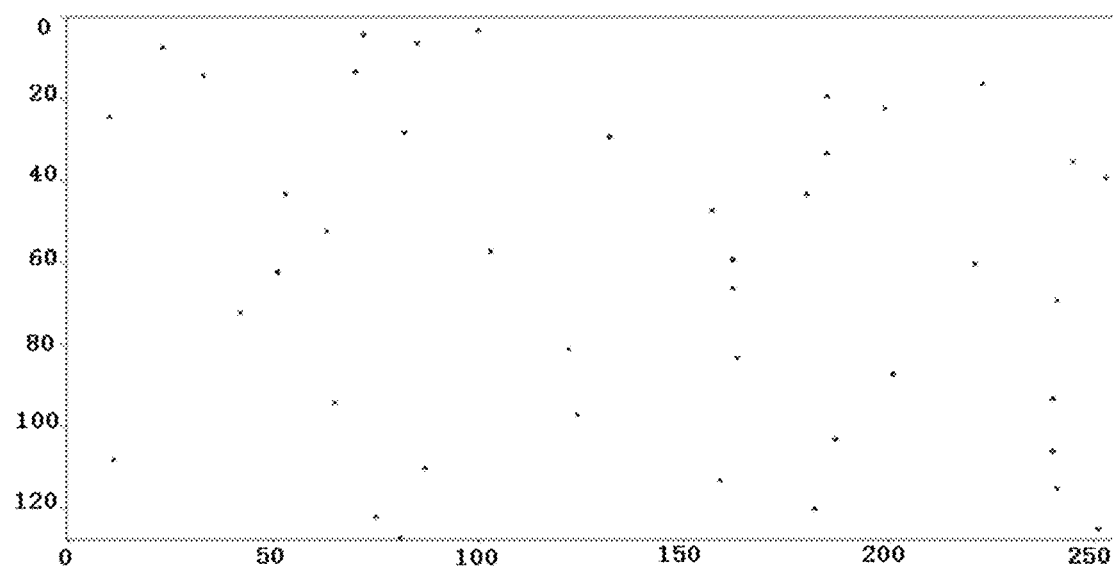
FIG. 5 is a schematic diagram of second error data distribution disclosed in the application.

The error correction process shown in FIG. 3 is implemented using a main control chip of a solid-state drive. It has been verified by experiments that with the use of only the LDPC and the main control chip of the solid-state drive, erroneous data bits in output data are 90 errors/4 KB, and details can be obtained with reference to FIG. 4. However, there are no erroneous data bits in the output data of the error correction process shown in FIG. 3, the number of erroneous data bits in the LSTM output data is reduced to 42, and details can be obtained with reference to FIG. 5. As can be seen, errors that cannot be corrected by the LDPC can be solved by this embodiment. Black dots in FIG. 4 and FIG. 5 represent erroneous data bits.

Figure 6:
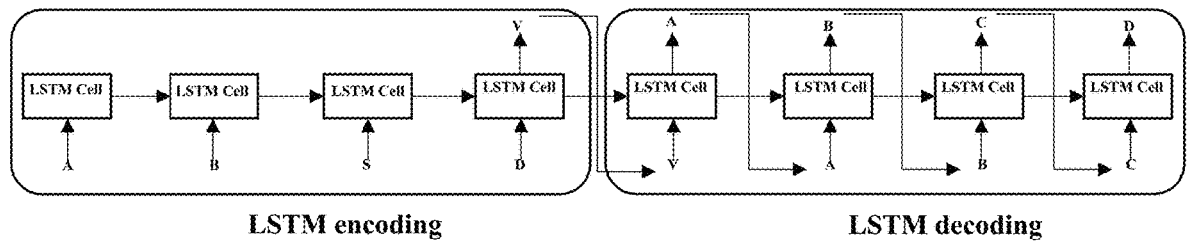
FIG. 6 is a schematic diagram of an LSTM for data error correction disclosed in the application.
Figure 7:
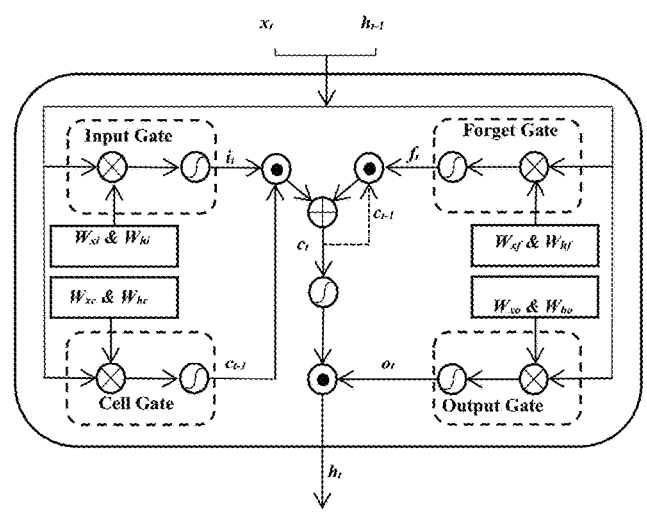
FIG. 7 is a schematic diagram of an LSTM Cell disclosed in the present application.

In this embodiment, a process of performing an error correction on data using the LSTM may be obtained with reference to FIG. 6. In FIG. 6, the LSTM corrects "ABSD" to "ABCD." It is assumed a file saves the four letters "ABCD" in an ASCII format, a total of 32 bits, which becomes "ABSD" when it is read again as storage time in the SSD is too long. First, the LSTM identifies that this is a four-letter string through encoding, but "AB SD" rarely appears in a file continuously, which may be caused by reading errors. Then, in a subsequent decoding process, the LSTM changes "ABSD" to "ABCD." The LSTM code in FIG. 6 allows code multiplexing and adapts to the situation of encoding and decoding pairing for different types of error correction, Each LSTM Cell in FIG. 6 may be obtained with reference to FIG. 7. In FIG. 7, $x_t$ and $h_{t-1}$ are input data of the LSTM Cell, $x_t$ is data to be processed by a current LSTM Cell, $h_{t-1}$ is an output result of a previous LSTM Cell, and the input data further includes $c_{t-1}$ output by the previous LSTM Cell. In FIG. 7, "Input Gate," "Forget Gate," "Cell Gate," and "Output Gate" are four processing gates of the current LSTM Cell, and these four processing gates process $x_t$ and $h_{t-1}$, respectively. An inner product operation is performed on a processing result $i_t$ of the "Input Gate" and a processing result $c_t$ of the "Cell Gate" to obtain a first inner product result, and an inner product operation is performed on a processing result $f_t$ of the "Forget Gate" and $c_{t-1}$ output by the previous LSTM Cell to obtain a second inner product result. Then, the first inner product result and the second inner product result are added to obtain a new $c_t$. The new $c_t$, after undergone an activation function, experiences an inner product processing with a processing result $o_t$ of the "Output Gate" to obtain $h_t$ output by the current LSTM Cell, where $h_t$ and $c_t$ output by the current LSTM Cell will be input to a next calculation cycle of the LSTM Cell at the same time.

In FIG. 7, "⊗" represents a vector-matrix multiplicatio operation, "⊕" represents an addition, "⊙" represents a Hadamard Product, and "⌀" represents an activation function. $W_x$ is a weight value of $x_t$ in the current processing gate, and $W_h$ is a weight value of $h_{t-1}$ in the current processing gate. For example, $W_{xi}$ is a weight value of $x_t$ in the "Input Gate", $W_{hi}$ is a weight value of $h_{t-1}$ in the "Input Gate", and so on. There are four processing gates in each LSTM Cell in the LSTM.

Figure 8:
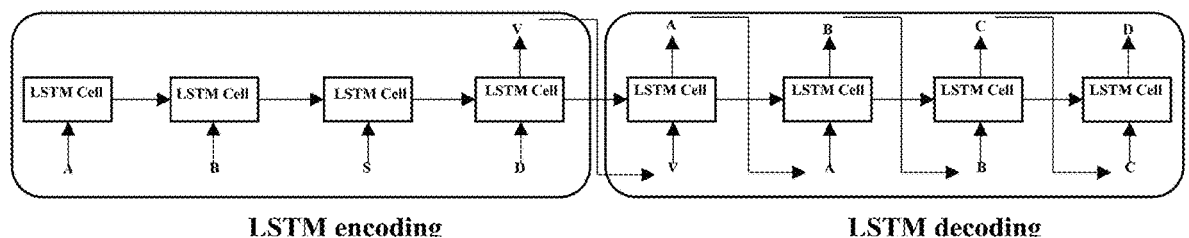
FIG. 8 is a schematic diagram of an LSTM for reverse-order data error correction disclosed in the present application.
Figure 9:
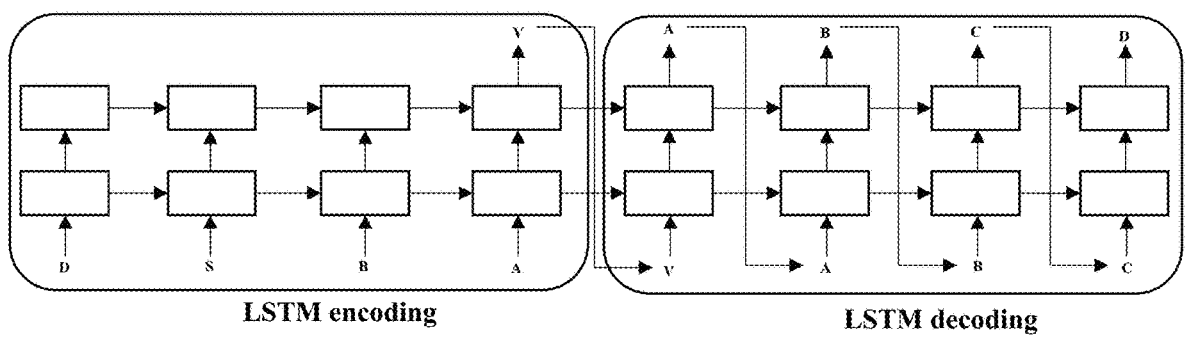
FIG. 9 is a schematic diagram of an LSTM network with a two-layer structure disclosed in the present application.

If "ABSD" is input to the network shown in FIG. 6 in a reverse order, an information bit "A" in encoding is closer to "A" in decoding. Similarly, an information bit "B" in encoding is closer to "B" in decoding. A scenario of inputting in the reverse order may be obtained with reference to FIG. 8. Each block in FIG. 6, FIG. 8, and FIG. 9 is an LSTM Cell set. The structure of each LSTM Cell in FIG. 6, FIG. 8, and FIG. 9 may be obtained with reference to FIG. 7.

Specifically, network parameters of the LSTM may be selected according to the following example. For example, if a file is encoded in a 32-bit Unicode Transformation Format (UTF-32), it may be more efficient to use the following network parameters:

Input sequence length: 128 (it should be 512 if calculated according to 2 KB/32, but it should not be too long; therefore, 128 is selected here); output sequence length: 128 (the same as the input sequence length); input vectors per step during encoding: 32 rows x 1 column binary; input vectors per step during decoding: 32 rows×1 column binary (it needs to use an indicator function for post-processing); and Basic LSTM Cells: 32, A multi-layer structure may also be set, so that the error correction capability of the network is enhanced. A two-layer structure is shown in FIG. 9. Each block in FIG. 9 is an LSTM Cell set. More LSTM Cells may further be set accordingly to form a three-layer network structure, a four-layer network structure, or a network structure with even more layers, thereby improving the correction accuracy of the LSTM.

Training of the LSTM: Collecting a variety of data that are as comprehensive as possible and accord with an error distribution to train an initial LSTM constructed to obtain a general LSTM. Further, the training data is divided according to spatial neighbors or a chronological order to obtain different training sets, and the two training sets are used for training the above general LSTM separately, thereby obtaining two more targeting LSTMs. Such LSTMs are more targeting, and the probability of successful error correction is higher, which is also valuable in scenarios where data is extremely important.

Figure 10:
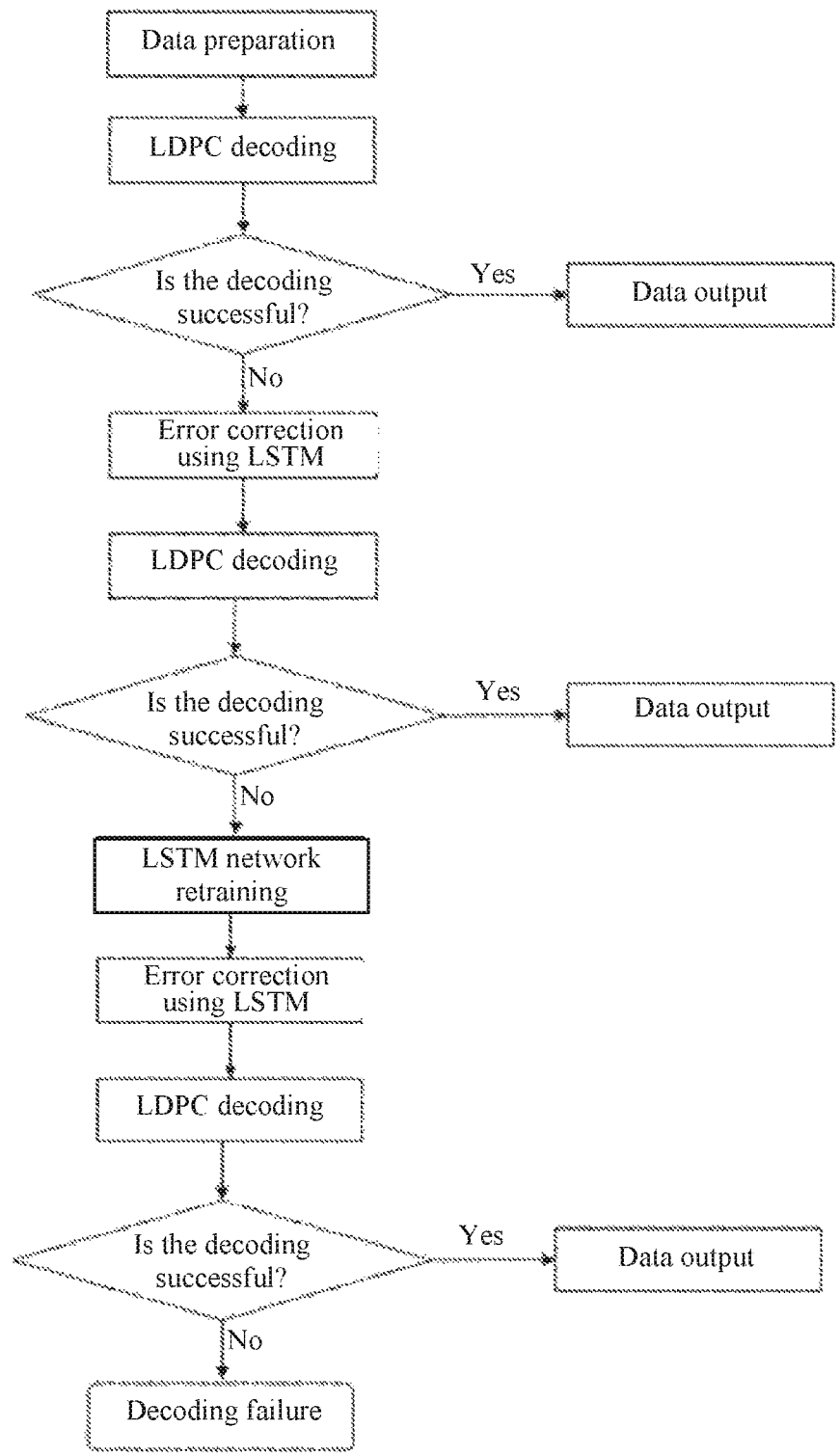
FIG. 10 is a flowchart of a fourth data error correction method disclosed in the application.

The currently used LSTM may also be retrained using the data to be error-corrected in the error correction process, and details may be obtained with reference to FIG. 10.

As it can be seen in this embodiment, the error correction capability of encoding and decoding is improved without increasing redundant bits for the error-correcting code. In the case of error correction failures in encoding and decoding, the LSTM can still assist it in correct error correction, which increases the success rate of the error correction.

A data error correction apparatus provided by an embodiment of the present application is introduced below. The data error correction apparatus described below and the data error correction method described above may be referred to each other.

Figure 11:
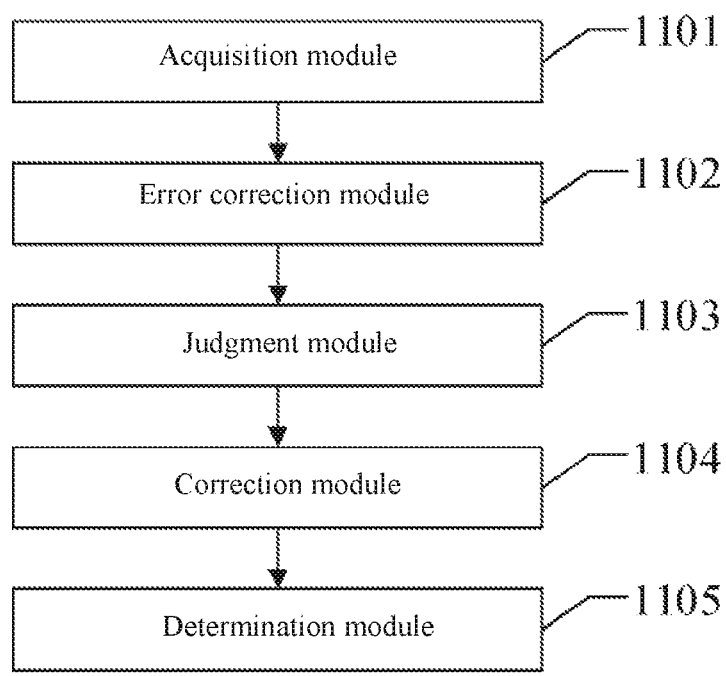
FIG. 11 is a schematic diagram of a data error correction apparatus disclosed in the application.

Referring to FIG. 11, a data error correction apparatus is disclosed in an embodiment of the present application, including:

acquisition module 1101 configured to acquire target data to be error-corrected;

error correction module 1102 configured to perform an error correction on the target data using an error-correcting code to obtain first data;

judgment module 1103 configured to judge whether the error correction of the first data is successful;

correction module 1104 configured to, if the error correction of the first data fails, correct the target data using a target neural network to obtain second data, determine the second data as the target data, and transmit the target data to the error correction module; and determination module 1105 configured to, if the error correction of the first data is successful, determine the first data as the target data that has been error-corrected.

In an implementation, the correction module includes:
a first separation unit configured to separate a data part and a check part of the target data; and
a correction unit configured to correct the data part using a target neural network to obtain second data.

In an implementation, the correction unit is specifically configured to:
input a data part of target data to a target neural network in a reverse order to obtain second data.

In an implementation, the error correction module includes:

a second separation unit configured to separate a data part and a check part of target data; and
a correction module configured to correct erroneous data bits of the data part using an error-correcting code to obtain first data.

In an implementation, the correction module is specifically configured to:
input target data to a target neural network in a reverse order to obtain second data.

In an implementation, it also includes a generation module configured to generate a target neural network, and the generation module includes:

a construction unit configured to construct an initial neural network, the initial neural network including an encoding subnetwork and a decoding subnetwork;

a first training unit configured to input training data including different types of data to train the initial neural network; and a third determination unit configured to determine, if an error loss function of the current initial neural network converges to a stable state during the training, the current initial neural network as the target neural network.

In an implementation, the generation module further includes:

a dividing unit configured to divide the training data into multiple data sets, data in each data set having an association relationship; and a second training unit configured to train the target neural network using each data set separately to obtain multiple target neural networks corresponding to the data sets.

In an implementation, the correction module is specifically configured to:
determine a data feature of the target data, and select, from the multiple target neural networks, a target neural network having the highest matching degree with the data feature to correct the target data, so as to obtain second data.

For the more specific working process of each module and unit in this embodiment, reference may be made to the corresponding content disclosed in the foregoing embodiments, which will not be repeated here.

As it can be seen, this embodiment provides a data error correction apparatus. After the apparatus corrects target data using an error-correcting code to obtain first data, if the error correction of the first data fails, the target data is corrected using a target neural network to obtain second data, and the second data is determined as the target data, so that the error-correcting code is used for correcting the data again to obtain the first data with the successful error correction. The first data is determined as the target data that has been error-corrected, and therefore, the correct target data is obtained. As can be seen, the present application can correct data using the error-correcting code and the target neural network cooperatively, so that failures of data error correction with the error-correcting code and data loss in the error correction process can be avoided.

A data error correction device provided by an embodiment of the present application is introduced below. The data error correction device described below and the data error correction method and apparatus described above can be referred to each other.

Figure 12:
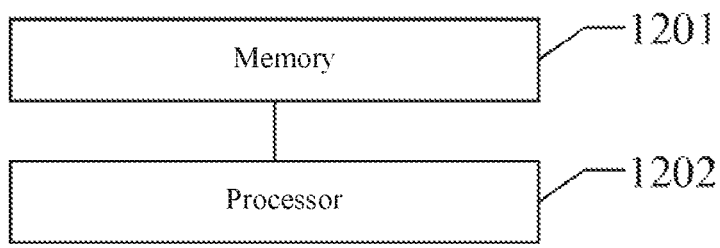
FIG. 12 is a schematic diagram of a data error correction device disclosed in the present application.

Referring to FIG. 12, a data error correction device is disclosed in an embodiment of the present application, including:

memory 1201 configured to save a computer program; and processor 1202 configured to execute the computer program to implement the method disclosed in any of the foregoing embodiments.

A readable storage medium provided by an embodiment of the present application is introduced below. The readable storage medium described below and the data error correction method, apparatus, and device described above may be referred to each other.

A readable storage medium configured to save a computer program is provided, where the computer program, when executed by a processor, implements the data error correction method disclosed in the foregoing embodiments. For the specific steps of the method, reference may be made to the corresponding content disclosed in the foregoing embodiments, which will not be repeated here.

"First," "second," "third," "fourth," and the like (if any) referred to in the present application are used for distinguishing similar objects and are not necessarily used for describing a specific order or sequence. It is to be understood that data so used may be interchanged under appropriate circumstances so that the embodiments described herein can be implemented in sequences other than those illustrated or described herein. Furthermore, terms such as "include," "have," and any variations thereof are intended to cover non-exclusive inclusion. For example, a process, a method, or a device including a series of steps or units is not necessarily limited to those steps or units expressly listed, but may include other steps or units not expressly listed or inherent to these processes, methods, or devices.

It should be noted that the descriptions involving "first," "second," and the like in the present application are only for the purpose of description, and should not be construed as indicating or implying their relative importance or implying the number of indicated technical features. Therefore, a feature delimited with "first" or "second" may expressly or implicitly include at least one feature. In addition, the technical solutions between the various embodiments can be combined with each other, but must be based on the realization by those of ordinary skill in the art. When the combination of technical solutions is contradictory or cannot be realized, it should be considered that the combination of such technical solutions does not exist, and is not within the protection scope claimed in the present application.

The various embodiments in this specification are described in a progressive manner, and each embodiment focuses on the differences from other embodiments, and the same or similar parts between the various embodiments may be referred to each other.

The steps of a method or an algorithm described with reference to the embodiments disclosed herein may be directly implemented in hardware, a software module executed by a processor, or a combination thereof. The software module may be placed in a random access memory (RAM), an internal memory, a read only memory (ROM), an electrically programmable ROM, an electrically erasable programmable ROM, a register, a hard disk, a removable disk, a CD-ROM, or a readable storage medium in any other form of that is well known in the technical field.

The principles and implementations of the present application are described herein using specific examples. The descriptions of the above embodiments are only used for helping understand the methods and core ideas of the present application. At the same time, for those of ordinary skill in the art, there will be changes in the specific implementations and application scope according to the spirit of the present application. To sum up, the content of this specification should not be construed as a limitation to the present application.

The invention claimed is:

1. A data error correction method, comprising:
   acquiring target data to be error-corrected;
   performing error correction on the target data using an error-correcting code (ECC) to obtain first ECC-corrected data;
   responsive to determining that the first ECC-corrected data have one or more first errors, correcting the target data using a target neural network to obtain network-corrected data, wherein the network-corrected data comprise a version of the target data corrected by the target neural network;
   responsive to determining that the network-corrected data have one or more second errors,
      updating the target data to be the network-corrected data; and
      performing the error correction on the updated target data using the ECC to obtain second ECC-corrected data; and
   responsive to the performing of the error correction on the updated target data being successful, determining the second ECC-corrected data as error-corrected target data which are error free.

2. The data error correction method according to claim 1, wherein correcting the target data using the target neural network to obtain the network-corrected data comprises:
   separating a data part and a check part of the target data; and
   correcting the data part using the target neural network to generate a processing result; and
   combining the processing result and the check part to obtain the network-corrected data.

3. The data error correction method according to claim 2, wherein correcting the data part using the target neural network to generate the processing result comprises:
   inputting the data part to the target neural network in a reverse order to generate the processing result.

4. The data error correction method according to claim 1, wherein correcting the target data using the target neural network to obtain the network-corrected data comprises:
   inputting the target data to the target neural network in a reverse order to obtain the network-corrected data.

5. The data error correction method according to claim 1, further comprising:
   constructing a neural network comprising an encoding subnetwork and a decoding subnetwork;
   inputting training data comprising different types of data to train the neural network; and
   responsive to an error loss function of the neural network converging to a steady state during the training, determining the neural network as the target neural network.

6. The data error correction method according to claim 5, wherein after determining the neural network as the target neural network, the method further comprises:
   dividing the training data into multiple data sets, different data in each data set having an association relationship; and
   training the target neural network using each data set separately to obtain multiple trained target neural networks corresponding to the multiple data sets, respectively.

7. The data error correction method according to claim 6, wherein correcting the target data using the target neural network to obtain the network-corrected data comprises:

determining data features of the target data; and
selecting, from the multiple trained target neural networks, a trained target neural network having the highest matching degree with the data features; and
correcting the target data using the trained target neural network to obtain the network-corrected data.

8. A data error correction device, comprising:
a memory configured to store a computer program; and
a processor configured to execute the computer program to perform operations comprising:
acquiring target data to be error-corrected;
performing error correction on the target data using an error-correcting code (ECC) to obtain first ECC-corrected data;
responsive to determining that the first ECC-corrected data have one or more first errors, correcting the target data using a target neural network to obtain network-corrected data, wherein the network-corrected data comprise a version of the target data corrected by the target neural network;
responsive to determining that the network-corrected data have one or more second errors,
updating the target data to be the network-corrected data; and
performing the error correction on the updated target data using the ECC to obtain second ECC-corrected data; and
responsive to the performing of the error correction on the updated target data being successful, determining the second ECC-corrected data as error-corrected target data which are error free.

9. The data error correction device according to claim 8, wherein to correct the target data using the target neural network to obtain the network-corrected data, the processor is configured to:
separate a data part and a check part of the target data;
correct the data part using the target neural network to generate a processing result; and
combine the processing result with the check part to obtain the network-corrected data.

10. The data error correction device according to claim 9, wherein to correct the data part using the target neural network to generate the processing result, the processor is configured to:
input the data part to the target neural network in a reverse order to generate the processing result.

11. The data error correction device according to claim 8, wherein to correct the target data using the target neural network to obtain the network-corrected data, the processor is configured to:
input the target data to the target neural network in a reverse order to obtain the network-corrected data.

12. The data error correction device according to claim 8, wherein the processor is further configured to:
construct a neural network comprising an encoding subnetwork and a decoding subnetwork;
input training data comprising different types of data to train the neural network; and
responsive to an error loss function of the neural network converging to a steady state during the training, determine the neural network as the target neural network.

13. The data error correction device according to claim 12, wherein after determining the neural network as the target neural network, the processor is further configured to:
divide the training data into multiple data sets, different data in each data set having an association relationship; and
train the target neural network using each data set separately to obtain multiple trained target neural networks corresponding to the multiple data sets, respectively.

14. The data error correction device according to claim 13, wherein to correct the target data using the target neural network to obtain the network-corrected data, the processor is further configured to:
determine data features of the target data; and
select, from the multiple trained target neural networks, a trained target neural network having the highest matching degree with the data features; and
correct the target data using the trained target neural network to obtain the network-corrected data.

15. A non-transitory computer-readable storage medium configured to store a computer program, wherein the computer program, when executed by a processor, implements a data error correction method comprising:
acquiring target data to be error-corrected;
performing error correction on the target data using an error-correcting code (ECC) to obtain first ECC-corrected data;
responsive to determining that the first ECC-corrected data have one or more first errors, correcting the target data using a target neural network to obtain network-corrected data, wherein the network-corrected data comprise a version of the target data corrected by the target neural network;
responsive to determining that the network-corrected data have one or more second errors,
updating the target data to be the network-corrected data; and
performing the error correction on the updated target data using the ECC to obtain second ECC-corrected data; and
responsive to the performing of the error correction on the updated target data being successful, determining the second ECC-corrected data as error-corrected target data which are error free.

16. The non-transitory computer-readable storage medium of claim 15, wherein correcting the target data using the target neural network to obtain the network-corrected data comprises:
separating a data part and a check part of the target data;
correcting the data part using the target neural network to generate a processing result; and
combining the processing result with the check part to obtain the network-corrected data.

17. The non-transitory computer-readable storage medium of claim 16, wherein correcting the data part using the target neural network to generate the processing result comprises:
inputting the data part to the target neural network in a reverse order to obtain the processing result.

18. The non-transitory computer-readable storage medium of claim 15, wherein the data error correction method further comprises:
constructing a neural network comprising an encoding subnetwork and a decoding subnetwork;
inputting training data comprising different types of data to train the neural network; and
responsive to an error loss function of the neural network converging to a steady state during the training, determining the neural network as the target neural network.

19. The non-transitory computer-readable storage medium of claim 18, wherein after determining the neural network as the target neural network, the data error correction method further comprises:

dividing the training data into multiple data sets, different data in each data set having an association relationship; and training the target neural network using each data set separately to obtain multiple trained target neural networks corresponding to the multiple data sets, respectively.

20. The non-transitory computer-readable storage medium of claim 19, wherein correcting the target data using the target neural network to obtain the network-corrected data comprises:

determining data features of the target data; and selecting, from the multiple trained target neural networks, a trained target neural network having the highest matching degree with the data features; and correcting the target data using the trained target neural network to obtain the network-corrected data.

* * * * *